United States Patent [19]

Green

[11] Patent Number: 5,008,526

[45] Date of Patent: Apr. 16, 1991

[54] PHOTODETECTOR OUTPUT COUPLING WITH LOW AND HIGH FREQUENCY OUTPUTS

[75] Inventor: Samuel I. Green, University City, Mo.

[73] Assignee: McDonnell Douglas Corporation, St. Louis, Mo.

[21] Appl. No.: 416,003

[22] Filed: Oct. 2, 1989

[51] Int. Cl.⁵ .............................................. H01J 40/14
[52] U.S. Cl. .......................... 250/214 R; 250/214 RC
[58] Field of Search ............ 250/214 R, 214 RC, 551; 307/311

[56] References Cited

U.S. PATENT DOCUMENTS

| | | | |
|---|---|---|---|
| 3,400,270 | 9/1968 | Durig | 250/214 RC |
| 3,437,823 | 4/1969 | Joyce | 250/214 R |
| 4,236,069 | 11/1980 | Laughlin | 250/214 R |
| 4,877,953 | 10/1989 | Yamamuro | 250/214 R |

Primary Examiner—David C. Nelms
Attorney, Agent, or Firm—Benjamin Hudson, Jr.; Guy R. Gosnell; Timothy H. Courson

[57] ABSTRACT

There is provided by this invention a photodetector and circuitry connected thereto wherein separate outputs are produced for low frequency and high frequency signals of the light impinging on the photodetector.

15 Claims, 2 Drawing Sheets

PHOTODETECTOR OUTPUT COUPLING WITH LOW AND HIGH FREQUENCY OUTPUTS

BACKGROUND OF THE INVENTION

1. FIELD OF THE INVENTION

This invention relates generally to photodetectors and circuits for coupling the output of photodetectors to amplifiers, oscilloscopes, or other circuitry for sensing and analyzing light inputs to the photodetectors.

2. BRIEF DESCRIPTION OF THE PRIOR ART

Many analytical systems and instruments utilize a photodetector to convert light energy into electrical energy and the electrical energy is measured or analyzed to determine the characteristics of the impinging light beam. The emergence of optical systems in new technologies or existing technologies that have given designers capability of having higher speed systems and systems with higher bandwidth has generated a need for developing photodetectors and photodetector circuits that have higher capabilities in analyzing the light energy that impinges upon the photodetector.

In most systems for sensing small optical signals, the photodetector output is coupled to a suitable amplifier. The optimum amplifier design would depend upon the speed of the response needed. A requirement for high speed of response results in higher amplifier noise and therefore poorer sensitivity. A requirement for less speed of response allows lower amplifier noise and therefore better sensitivity. The selection of the amplifier that is optimized for speed or sensitivity causes some tradeoff balancing these two Parameters. If a slow signal and a fast signal are sensed at the same time by the same photodetector, the preamplifier is traditionally optimized for the faster signal while extra noise due to the wideband amplifier is tolerated in recovering the slow signal.

It is an object of this invention to provide circuitry which allows the derivation of signals from both sides of a photodetector so that two different requirements can be met simultaneously with the same photodetector.

SUMMARY OF THE INVENTION

There is provided by this invention a photodetector and photodetector circuitry wherein light that is comprised of low frequency and high frequency signals impinges upon the photodetector and the resulting signal is routed by circuitry that separates the low frequency signals and the high frequency signals so that two separate outputs are provided. The low frequency preamplifier may be optimized to provide improvement in the signal to noise ratio in the low frequency signal channel and the high frequency preamplifier may be separately optimized to provide the best signal to noise ratio consistent with high speed operation.

BRIEF DESCRIPTION OF THE PREFERRED EMBODIMENT

Figure 1:
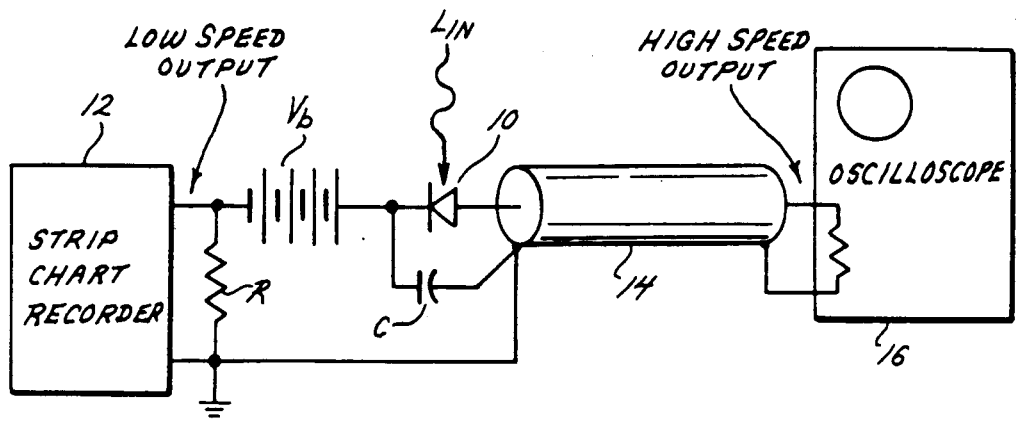
FIG. 1 illustrates a photodetector having a separate high speed output and low speed output incorporating the principles of this invention.

Referring to FIG. 1, there is shown a simple example of an implementation incorporating the principles of this invention. A photodetector 10 is mounted in a high speed mount not shown, but may be at a type disclosed in U.S. Pat. No. 4,103,157, assigned to the assignee for this application. A bias supply $V_b$ for the photodetector 10 in the high speed mount is returned to ground through a resistor R. The voltage across this resistor is proportional to the photocurrent and may be fed to a strip chart recorder 12 or other indicating device to display the average photocurrent due to the optical power $L_{in}$ incident on the photodetector. A signal to the strip chart recorder 12 represents the low speed output of the circuit. At the same time, the normal high speed output of the photodetector is obtained by connecting the output of the high speed mount by way of a coaxial cable 14 to a fast oscilloscope 16 or other wideband preamplifier or instrument. The output supplied to the high speed oscilloscope 16 and the strip chart recorder 12 are independent and have a minimal effect on one another.

Figure 2:
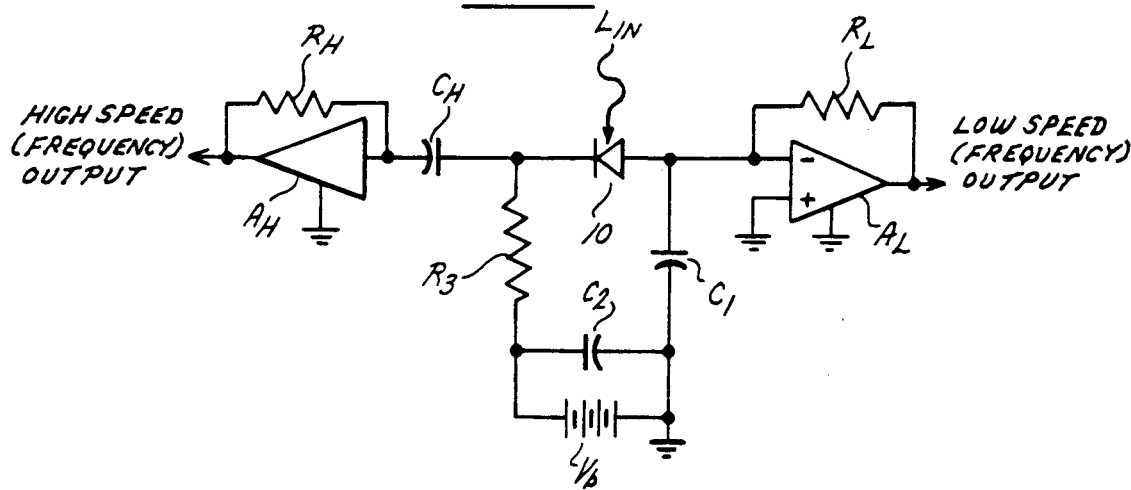
FIG. 2 illustrates a photodetector with separate high frequency output and low frequency output incorporating separate high speed and low speed transimpedence preamplifiers.

Referring now to FIG. 2, there is shown a photodetector having low frequency and high frequency preamplifier circuits to achieve a low frequency output and a high frequency output. In this example, light $L_{in}$ impinging upon the photodetector 10 is amplitude modulated by signals in two frequency ranges at the same time. The Photodetector 10 is part of circuitry which provides separate paths for high frequency and low frequency signals. The high frequency path is a complete loop consisting of capacitor $C_1$, photodetector 10, capacitor $C_H$, the amplifier $A_H$, and the return through ground. The low frequency path is a complete loop consisting of the bias voltage supply $V_b$, Resistor $R_3$, the photodetector 10, the amplifier $A_L$, and the return path through ground. The low frequency transimpedence preamplifier $A_L$ provides a DC coupled low frequency output, while the wideband transimpedence preamplifier $A_H$ provides a wideband high frequency high speed output. These separate preamplifiers can be separately optimized to perform their individual tasks. Ordinarily, a single wideband preamplifier would be used to recover both low and high frequency signals, and low frequency performance would therefore suffer due to the higher spectral noise density of the wideband preamplifier. Optimization of the separate low frequency preamplifier $A_L$ allows a large improvement in signal to noise ratio of the low frequency signal channel. An application where this is useful is in optical communication tracking systems where wideband data and low frequency track signals are received by the same photodetector and optimally processed by separate preamplifiers.

Figure 3:
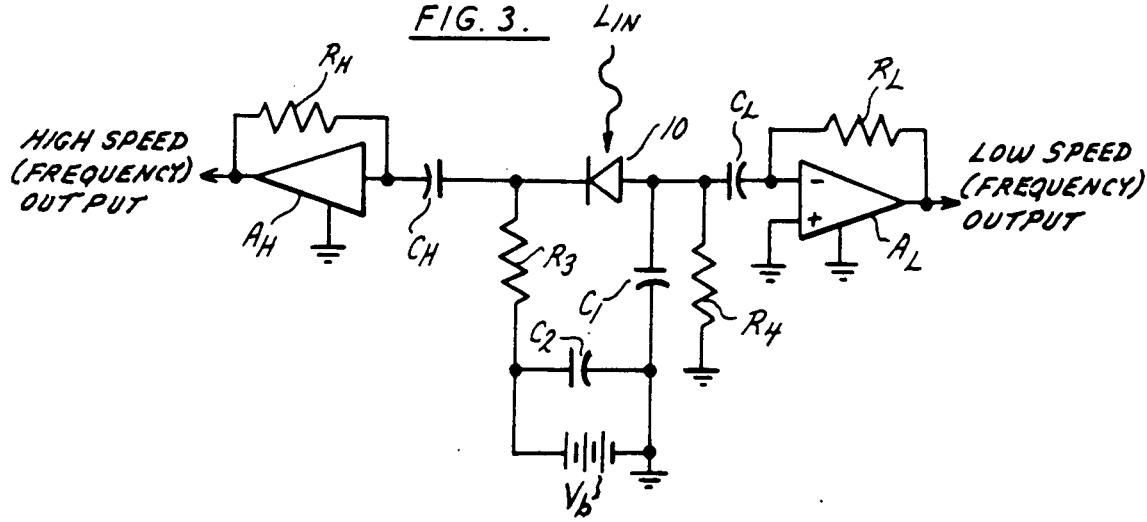
FIG. 3 is a photodetector with separate high frequency output and low frequency output incorporating AC coupling to the low speed preamplifier and a DC path for photocurrent.

Referring to FIG. 3, there is shown a modification of the circuits shown in FIG. 2 wherein the capacitor $C_L$ is added to the low frequency path to block DC signals from preamplifier $A_L$ which may be desirable to increase dynamic range. The resistor R4 provides a DC path for the photodetector current. Except for lack of DC coupling, this circuit has the same advantages as FIG. 2 as well as being able to accommodate larger signal and background levels without saturating.

Figure 4:
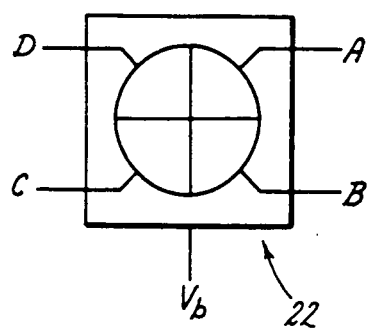
FIG. 4 illustrates an electrode connections for a representative quadrant photodiode detector.
Figure 5:
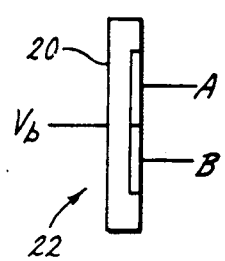
FIG. 5 illustrates a side view of electrode connections of a quadrant detector having bias voltage connected to the common electrode of the quandrant photodiode detector illustrated in FIG. 4.
Figure 6:
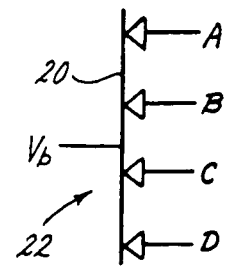
FIG. 6 illustrates a schematical representation of a quadrant photodiode detector of FIG. 4.

FIGS. 4, 5, and 6 illustrate a quadrant photodiode detector that is divided into four pie shaped quadrants A, B, C, and D. Such quadrant divided photodiodes are widely used to acquire and track distant optical sources by comparing outputs from opposite sides of the quadrant photodetector to develop error correction signals for both axes. These error signals are used to steer the optical system toward the distant source and to drive the optical signal to the center of the quadrant photodetector. The common side 20 of the quadrant photodetector 22 is normally where the bias potential is applied as illustrated in FIGS. 4 and 5. FIG. 6 illustrates a schematical representation of a quadrant detector 22 of FIG. 4.

Figure 7:
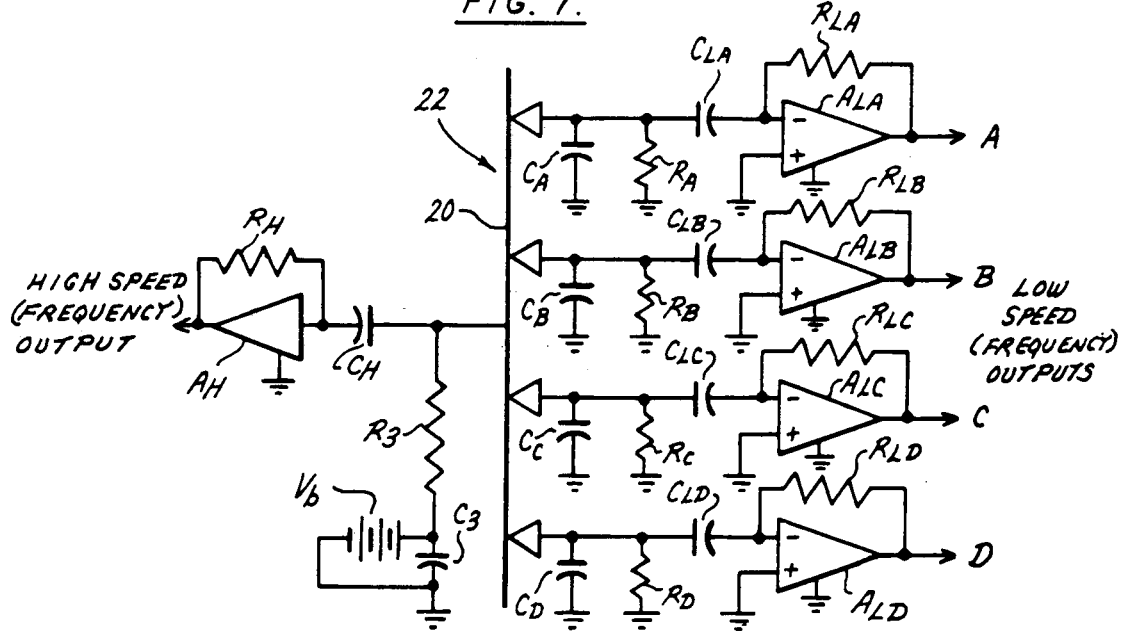
FIG. 7 illustrates a schematical representation of a quadrant detector having separate low frequency outputs and high frequency output incorporating the principles of this invention.

FIG. 7 illustrates a schematical representation of a quadrant detector 22 having separate low frequency outputs and high frequency output. Each quadrant of the detector 22 is connected to one of the four low frequency preamplifiers $A_{LA}$, $A_{LB}$, $A_{LC}$, and $A_{LD}$. The bias voltage $V_b$ and the high frequency amplifier $A_H$ are coupled to the common side 20 of the quadrant detector 22 by means of Resistor $R_3$ and capacitor $C_H$, respectively. The capacitors $C_A$, $C_B$, $C_C$, and $C_D$ have small values and are positioned closely to the quadrant detector 22 to provide a high frequency return path with little parasitic reactance. The resistors $R_A$, $R_B$, $R_C$, and $R_D$ are DC return paths required to allow photocurrent flow.

This application would normally require separate photodetectors for tracking and communication in order to optimize preamplifiers for the appropriate frequency ranges. This method uniquely allows optimization of all desired operating parameters without the optical losses associated with splitting the optical signal between two photodetectors.

Although there has been illustrated and described specific detail and structure of operations, it is clearly understood that the same were merely for purposes of illustrations and that changes and modifications may be readily made therein by those skilled in the art without departing from the spirit and the scope of this invention.

I claim:

1. A photodetector output circuit, comprising:
    (a) a photodetector means for detecting light impinging thereon having a first electrode and a second electrode;
    (b) a first connection means for detecting high frequency components of the impinging light connected to the first electrode of the photodetector means providing a high frequency output;
    (c) a second connection means for detecting low frequency components of the impinging light connected to the second electrode of the photodetector means providing a low frequency output; and
    (d) electrical circuit means for analyzing the high and low frequency outputs of the photodetector means connected to the outputs of the first and second connection means.

2. A photodetector output circuit as recited in claim 1 wherein the first connection means is a preamplifier.

3. A photodetector output circuit as recited in claim 1 wherein the second connection means is a preamplifier.

4. A photodetector output circuit as recited in claim 1 wherein the first and second connection means are preamplifiers.

5. A photodetector output circuit as recited in claim 1 wherein the photodetection means is a photodiode.

6. A photodetector output circuit, comprising:
    (a) a photodetector means for detecting light impinging thereon having a divided electrode means for detecting light in discrete segments of the photodetector means and a common electrode means for all segments;
    (b) a first connection means for detecting high frequency components of the impinging light connected to the common electrode means of the photodetector means providing a high frequency output;
    (c) a plurality of connection means for detecting low frequency components of the impinging light wherein each connection means of said plurality of connection means are connected to a segment of the divided electrode means providing separate outputs for the various segments of the photodetector means; and
    (d) electrical circuit means for analyzing the high and low frequency outputs of the photodetector means connected to the outputs of the first connection means and plurality of connection means.

7. A photodetector output circuit as recited in claim 6 wherein the first connection means is a preamplifier.

8. A photodetector output circuit as recited in claim 6 wherein the plurality of connection means are preamplifiers.

9. A photodetector output circuit as recited in claim 6 wherein the first connection means and the plurality of connection means are preamplifiers.

10. A photodetector output circuit as recited in claim 6 wherein the photodetection means is a photodiode.

11. A photodetector output circuit, comprising:
    (a) a photodetector means for detecting light impinging thereon having a divided electrode means for detecting light in discrete segments of the photodetector means and a common electrode means for all segments;
    (b) a first connection means for detecting low frequency components of the impinging light connected to the common electrode means of the photodetector means providing a low frequency output;
    (c) a plurality of connection means for detecting high frequency components of the impinging light wherein each connection means of said plurality of connection means are connected to a segment of the divided electrode means providing separate outputs for the various segments of the photodetector means; and
    (d) electrical circuit means for analyzing the high and low frequency outputs of the photodetector means connected to the outputs of the first connection means and plurality of connection means.

12. A photodetector output circuit as recited in claim 11 wherein the first connection means is a preamplifier.

13. A photodetector output circuit as recited in claim 11 wherein the plurality of connection means are preamplifiers.

14. A photodetector output circuit as recited in claim 11 wherein the first connection means and the plurality of connection means are preamplifiers.

15. A photodetector output circuit as recited in claim 11 wherein the photodetection means is a photodiode.

* * * * *